US010015416B2

(12) United States Patent
Borthakur et al.

(10) Patent No.: US 10,015,416 B2
(45) Date of Patent: Jul. 3, 2018

(54) IMAGING SYSTEMS WITH HIGH DYNAMIC RANGE AND PHASE DETECTION PIXELS

(71) Applicant: SEMICONDUCTOR COMPONENTS INDUSTRIES, LLC, Phoenix, AZ (US)

(72) Inventors: Swarnal Borthakur, Boise, ID (US); Ulrich Boettiger, Garden City, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 35 days.

(21) Appl. No.: 15/162,914

(22) Filed: May 24, 2016

(65) Prior Publication Data

US 2017/0347042 A1 Nov. 30, 2017

(51) Int. Cl.
*H04N 5/355* (2011.01)
*H01L 27/146* (2006.01)
*H04N 5/369* (2011.01)
*G02B 13/00* (2006.01)

(52) U.S. Cl.
CPC ......... *H04N 5/355* (2013.01); *G02B 13/0045* (2013.01); *H01L 27/14627* (2013.01); *H04N 5/35563* (2013.01); *H04N 5/3696* (2013.01)

(58) Field of Classification Search
CPC .. H04N 5/355; H04N 5/35563; H04N 5/3696; H04N 5/2254; H01L 27/14627; G02B 13/0045
See application file for complete search history.

(56) References Cited

U.S. PATENT DOCUMENTS

| 2012/0268634 | A1* | 10/2012 | Fukuda | H01L 27/14605 348/302 |
|---|---|---|---|---|
| 2013/0033636 | A1 | 2/2013 | Pitts et al. | |
| 2013/0182155 | A1* | 7/2013 | Egawa | H01L 27/14627 348/294 |
| 2015/0229833 | A1* | 8/2015 | Numata | H04N 5/3696 348/294 |
| 2016/0071893 | A1* | 3/2016 | Shinohara | H01L 27/14605 257/432 |
| 2017/0104942 | A1* | 4/2017 | Hirota | H04N 5/35563 |

OTHER PUBLICATIONS

Boettiger, U.S. Appl. No. 14/591,763, filed Jan. 7, 2015.

* cited by examiner

*Primary Examiner* — Albert Cutler
(74) *Attorney, Agent, or Firm* — Treyz Law Group, P.C.; Tianyi He; Vineet Dixit

(57) ABSTRACT

An image sensor may have a pixel array, and the pixel array may include a plurality of image pixels that gather image data and a plurality of phase detection pixels that gather phase information. The phase detection pixels may be arranged in phase detection pixel blocks, and each phase detection pixel group may include edge pixels. The edge pixels of each phase detection pixel group may be covered by microlenses that also cover a portion of a center pixel. The pixel array may also include high dynamic range pixel blocks. Each high dynamic range pixel block may include pixels within the phase detection pixel block and other pixels (e.g., corner pixels). A subset of the plurality of image pixels in the pixel array may be arranged in pixel blocks. Each pixel block may include a phase detection pixel block and a high dynamic range pixel block.

17 Claims, 14 Drawing Sheets

IMAGING SYSTEMS WITH HIGH DYNAMIC RANGE AND PHASE DETECTION PIXELS

BACKGROUND

This relates generally to imaging systems and, more particularly, to imaging systems with high dynamic range functionalities and phase detection capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Conventional imaging systems also may have images with artifacts associated with low dynamic range. Scenes with bright and dark portions may produce artifacts in conventional image sensors, as portions of the image may be over exposed or under exposed.

It would therefore be desirable to be able to provide improved imaging systems with high dynamic range functionalities and depth sensing capabilities.

DETAILED DESCRIPTION

Figure 1:
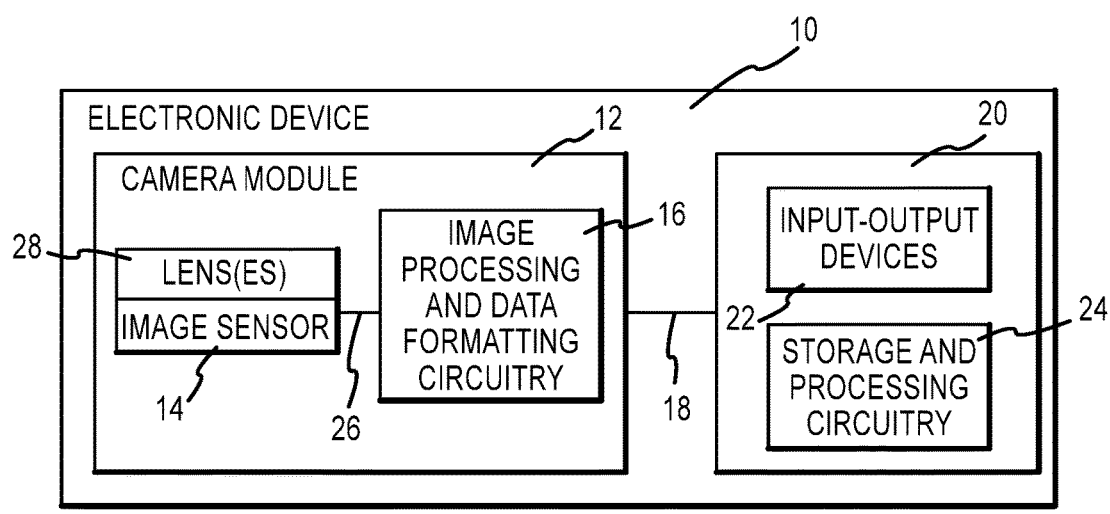
FIG. 1 is a schematic diagram of an illustrative electronic device with an image sensor that may include phase detection pixels in accordance with an embodiment of the present invention.

Embodiments of the present invention relate to image sensors with high dynamic range (HDR) functionalities and depth sensing capabilities. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. If desired, camera sensor 14 and image processing circuitry 16 may be formed on separate semiconductor substrates. For example, camera sensor 14 and image processing circuitry 16 may be formed on separate substrates that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with high dynamic range functionalities (e.g., to use in low light and high light environments, to compensate for high light points of interest in low light environments and vice versa). To provide high dynamic range functionalities, image sensor 14 may include high dynamic range pixel blocks.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel blocks such as phase detection pixel block 100 shown in FIG. 2A. If desired, pixel blocks that provide depth sensing capabilities may also provide high dynamic range functionalities.

Figure 2A:
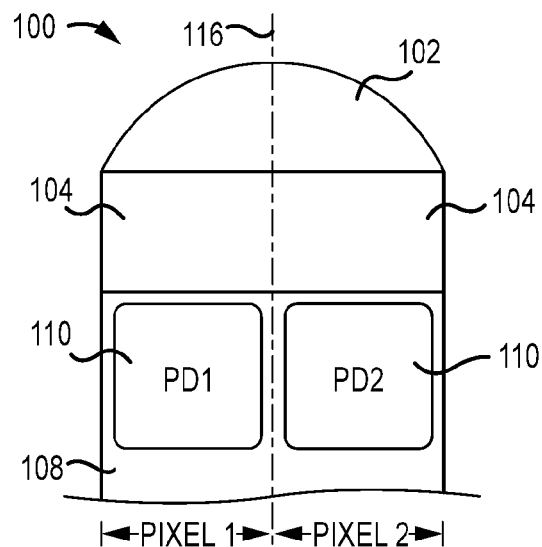
FIG. 2A is a cross-sectional side view of illustrative phase detection pixels having photosensitive regions with different and asymmetric angular responses in accordance with an embodiment of the present invention.

FIG. 2A is an illustrative cross-sectional view of pixel block 100. In FIG. 2A, phase detection pixel block 100 is a pixel pair. Pixel pair 100 may include first and second pixels such Pixel 1 and Pixel 2. Pixel 1 and Pixel 2 may include photosensitive regions such as photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. In an alternate embodiment, three phase detection pixels may be arranged consecutively in a line in what may sometimes be referred to as a 1×3 or 3×1 arrangement.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the wavelengths corresponding to a green color, a red color, a blue color, a yellow color, a cyan color, a magenta color, visible light, infrared light, etc.). Color filter 104 may be a broadband color filter. Examples of broadband color filters include yellow color filters (e.g., yellow color filter material that passes red and green light) and clear color filters (e.g., transparent material that passes red, blue, and green light). In general, broadband filter elements may pass two or more colors of light. Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

Figures 2B, 2C:
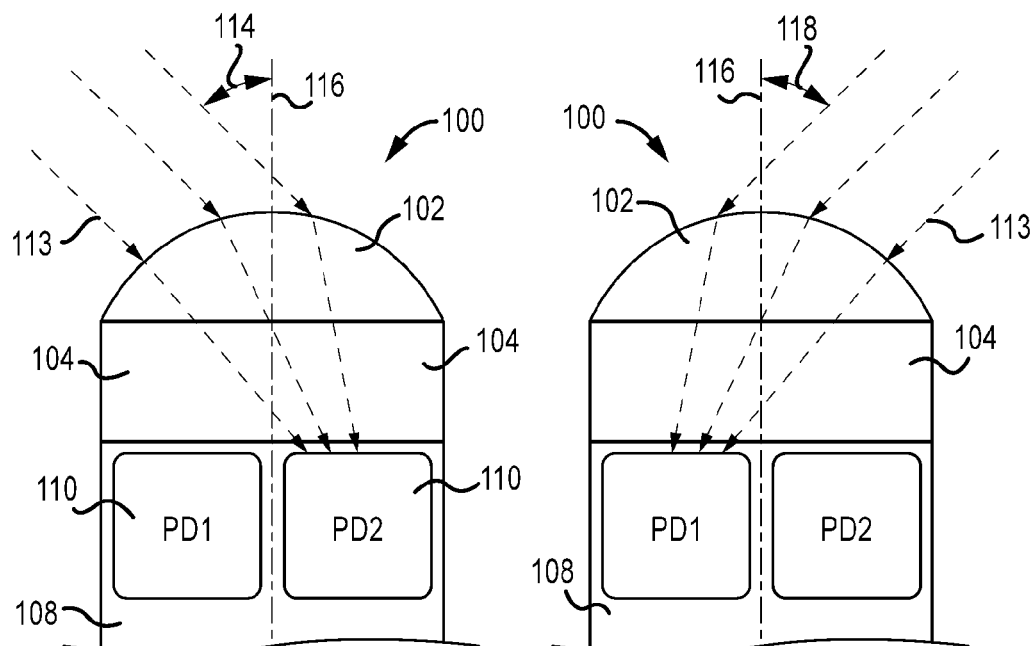
FIGS. 2B and 2C are cross-sectional views of the phase detection pixels of FIG. 2A in accordance with an embodiment of the present invention.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
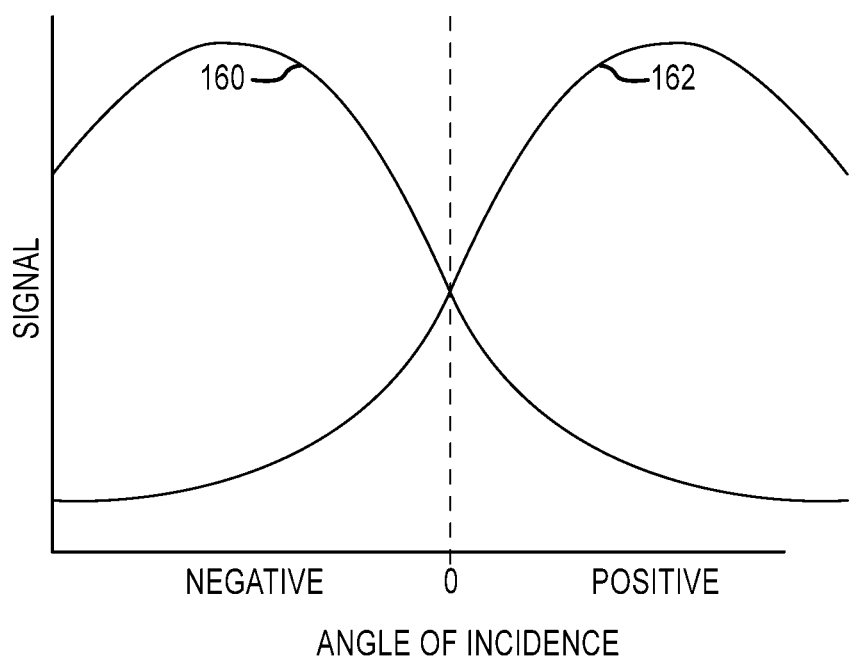
FIG. 3 is a diagram of illustrative signal outputs of photosensitive regions of depth sensing pixels for incident light striking the depth sensing pixels at varying angles of incidence in accordance with an embodiment of the present invention.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the image signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in image sensor 14 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel blocks that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

As previously mentioned, the example in FIGS. 2A-2C where phase detection pixel block 100 includes two adjacent pixels is merely illustrative. In another illustrative embodiment, phase detection pixel block 100 may include multiple adjacent pixels that are covered by varying types of microlenses. Examples of embodiments of this type are shown in FIGS. 4-13.

Figure 4:
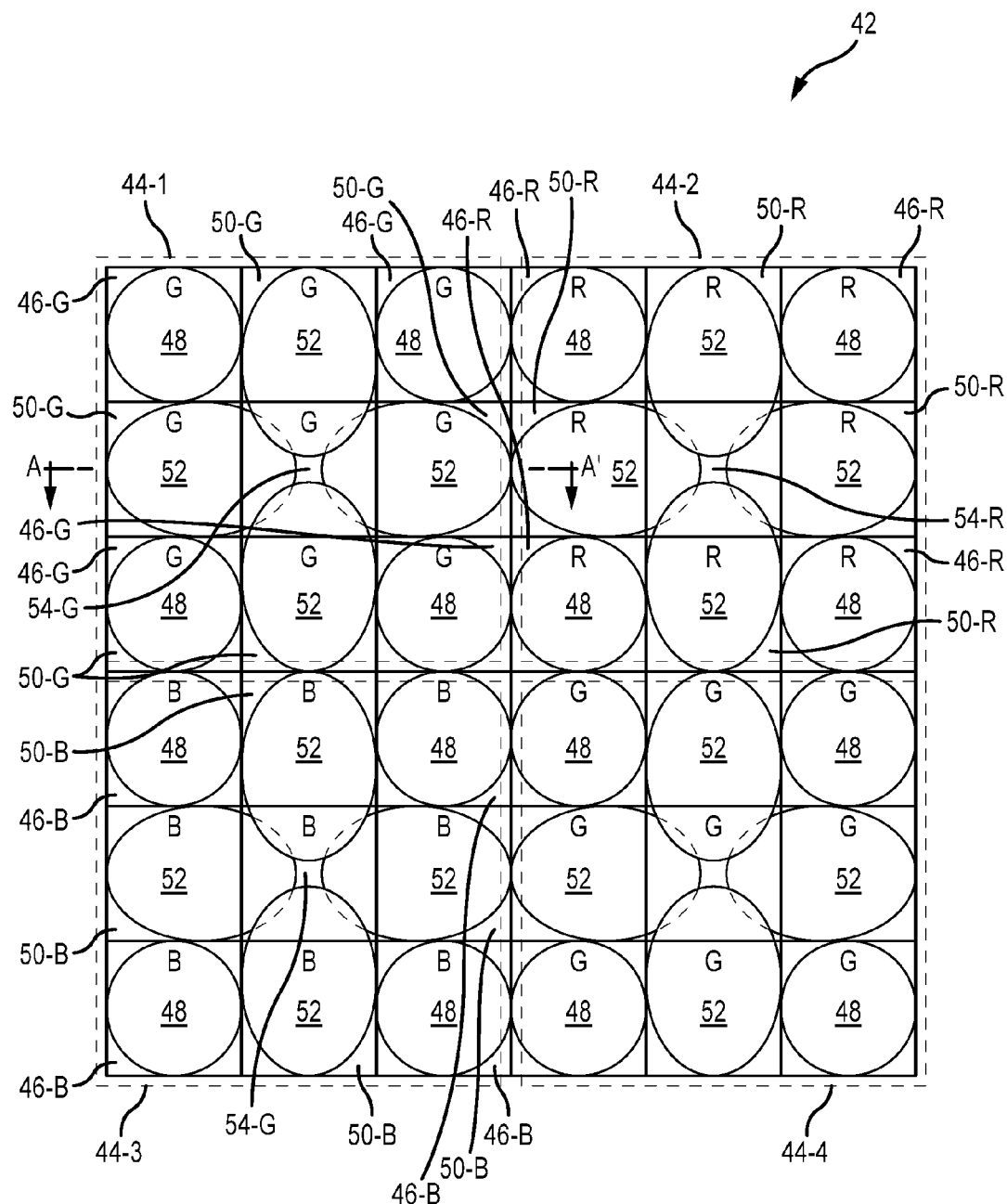
FIG. 4 is a top view of an illustrative pixel array with microlens groups having standard and oversized microlenses in accordance with an embodiment of the present invention.

FIG. 4 shows an illustrative pixel array 42 having phase detection pixel blocks and various microlens groups. Pixel array 42 includes a color filter array. Pixels marked with an R include a red color filter, pixels marked with a G include a green color filter, and pixels marked with a B include a blue color filter. Pixel array 42 may include photosensitive region blocks 44 (sometimes referred to herein as pixel blocks 44 or photodiode blocks 44) that may be repeated across the array. Each pixel block 44 may include nine pixels that form a 3×3 pixel subarray. Each pixel block 44 may include first, second, and third rows, each of which includes 3 pixels. Each pixel block 44 may also include first, second, and third columns, each of which includes 3 pixels.

Each pixel in the subarray may have a same-colored color filter. For example, pixel block 44-1 may include nine pixels that form a 3×3 pixel subarray, where each pixel in the subarray has a green color filter. Pixel block 44-2 may include nine pixels that form a 3×3 pixel subarray, where each pixel in the subarray has a red color filter. Pixel block 44-3 may include nine pixels that form a 3×3 pixel subarray, where each pixel in the subarray has a blue color filter. Pixel block 44-4 may include nine pixels that form a 3×3 pixel array, where each pixel in the subarray has a green color filter. Pixel groups 44 may include pixel group 44-1, 44-2, 44-3, 44-4, or any other desired pixel group with a desired set color filters.

The pattern of color filters for pixel blocks 44 in pixel array 42 is a Bayer mosaic pattern which includes a repeating unit cell of 6×6 image pixels or 2×2 image pixel blocks having two 3×3 green image pixel blocks 44-1 and 44-4 arranged on one diagonal and one 3×3 red image pixel block 44-2 and one 3×3 blue image pixel block 44-3 arranged on the other diagonal. This example is merely illustrative, and other color filter patterns may be used if desired. For example, a broadband color filter (e.g., a yellow or clear color filter) may be used instead of a green color filter in the color filter array.

Pixel block 44-1 may include corner pixels 46-G. Corner pixels 46-G may be covered by standard microlenses 48. Standard microlenses may be defined as microlenses that cover only a single pixel (e.g., 46-G). If desired, microlenses 48 may partially cover the single pixel. Standard microlenses 48 may direct (e.g., focus) incident light to the single pixel that it covers. Microlenses 48 may be round (e.g., circular, oval), but if desired may be any other desired shape to serve the purpose focusing light onto the single pixel.

Pixel block 44-1 may also include edge pixels 50-G and center pixel 54-G. Oversized microlenses 52 may each cover a corresponding edge pixel 50-G and a portion of center pixel 54-G. Microlenses 52 may cover a larger portion of the corresponding edge pixel 50-G compared to the portion of the center pixel 54-G covered by microlenses 52. Edge pixels 50-G collectively may be the phase detection pixel block in pixel block 44-1. Oversized microlenses 52 may direct incident light away from center pixel 54-G and focus the directed incident light onto the respective edge pixel 50-G. Microlenses 52 may have an elliptical shape, but if desired may be any other desired shape to serve the purpose of redirecting incoming light from center pixel 54-G to the corresponding edge pixel 50-G. Imaging signals from pixels and 54-G may be analyzed to determine phase information.

Pixel block 44-4 may have the same configuration as pixel block 44-1 in this example. However, in another example, pixel block 44-4 may have a differently-colored color filter layout than pixel block 44-1. In yet another example, pixel block 44-4 may have a different set of microlenses with a different microlens configuration than pixel block 44-1.

Pixel block 44-2 may have the same microlens configuration as pixel block 44-1. Pixels within pixel block 44-2 may have red color filters instead of green color filters. Pixel block 44-3 may have the same microlens configuration as pixel block 44-1. Pixels within pixel block 44-3 may have blue color filters instead of green color filters. Pixel block 44-4 may have the same microlens configuration as pixel block 44-1. Pixels within pixel block 44-4 may have green color filters.

As shown in connection with FIGS. 2A-2C, oversized microlenses 52 may help generate an angular response within the phase detection pixel block and support depth sensing capabilities of image sensor 14. Microlenses 52 within a pixel block 44 (e.g., pixel block 44-1, pixel block 44-2, pixel block 44-3, or pixel block 44-4) may overlap with one another. Alternatively, microlenses 52 may overlap the center pixel, which microlenses 52 partially cover.

If desired, pixel array 42 may be used in high dynamic range applications. In order to increase the dynamic range of the imaging sensor, different pixels with varying types of microlenses covering them in the pixel array may be exposed to varying amounts of incident light because of the microlens configuration. For example, some of the pixels (e.g., corner pixels covered by microlens 48) in pixel array 42 may have an amount of light (sometimes referred to as a standard amount of light) focused onto the pixel. Some of the pixels (e.g., edge pixels covered by microlens 52) in pixel array 42 may have a larger amount of light focused onto the pixel, while other pixels (e.g., center pixels partially covered by microlens 52) in pixel array 42 may have a smaller amount of light focused onto the pixel compared to the standard amount of light. As an example, the pixels used for high dynamic range applications may be referred to as a high dynamic range pixel block.

In such a way, pixel array 42 may be configured to have three types of light exposure pixels. The three types of light exposure pixels may include low light pixels, normal light pixels, and high light pixels. Having three types of light exposure pixels gives more flexibility for gather light information under specific light conditions.

If desired, different pixels in the pixel array may also be exposed to incident light for varying amounts of time to further increase the dynamic range.

Figure 5:
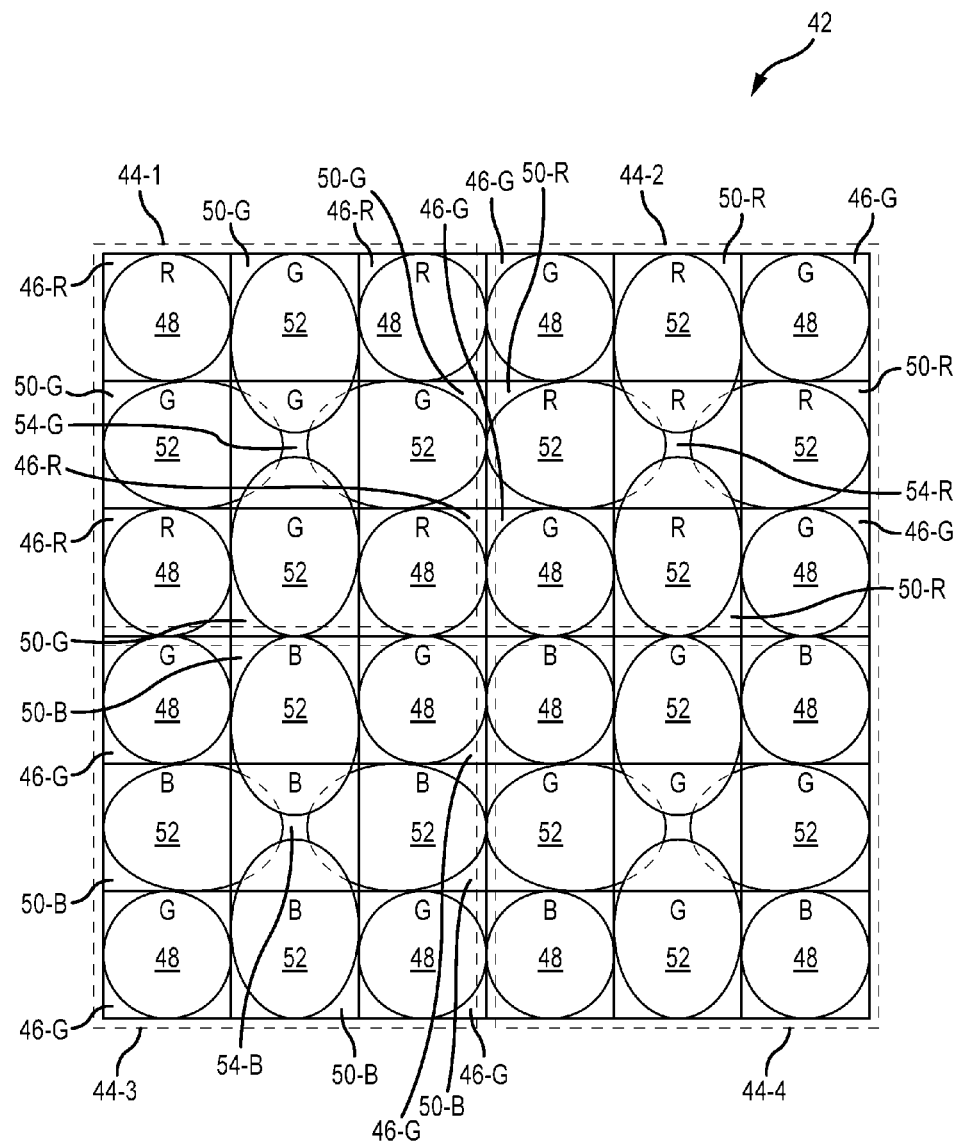
FIG. 5 is a top view of an illustrative pixel array with the microlens groups as shown in FIG. 4 while having a different color filter pattern in accordance with an embodiment of the present invention.

FIG. 5 shows an illustrative pixel array 42 having phase detection pixel blocks and various microlens groups. Pixel blocks 44 may have a different color filter pattern while maintaining the same microlens groups as FIG. 4. Pixel block 44-1 may include corner pixels 46-R with red color filters as shown in FIG. 5 instead of corner pixels 46-G with green color filters as shown in FIG. 4. Similarly, pixel block 44-2 may include corner pixels 46-G with green color filters instead of corner pixels 46-R with red color filters. Pixel block 44-3 may include corner pixels 46-G with green color filters instead of corner pixels 46-B with blue color filters. Pixel block 44-4 may include corner pixels 46-B with blue color filters instead of corner pixels 46-G with green color filters.

The arrangement shown in FIG. 5 preserves a color pattern between the corner pixels for each respective pixel block 44. Likewise, the arrangement shown in FIG. 5 also preserves a different color pattern between the edge and center pixels for each respective pixel block 44. Since the edge pixels constitute the phase detection pixel blocks of the respective pixel blocks 44, pixel array 42 may retain the same depth sensing capabilities previously discussed in FIG. 4. Moreover, a more diverse set of data regarding color may be gathered using the arrangement shown in FIG. 5.

Pixel blocks 44 in FIG. 5 may also retain their high dynamic range capabilities with three types of light exposure pixels as discussed in FIG. 4. Furthermore, since each pixel block 44 gathers more than one type of color-specific light data, there is better color resolution in the image data generated by pixel array 42.

In FIGS. 6-13, the color filter patterns and related pixel block details are not illustrated and discussed in further detail, in order to avoid unnecessarily obscuring the present embodiments and the drawings of FIGS. 6-13. FIGS. 6-13 are discussed with the color filter pattern shown in FIG. 4. However, this example is merely illustrative. If desired, the color filter pattern in FIG. 5 or any other desired color filter patterns may be used. Additionally, edge pixels for each respective pixel block 44 may be generally referred to as edge pixels 50, corner pixels for each respective pixel block 44 may be generally referred to as corner pixels 46, and center pixels for each respective pixel block 44 may be generally referred to as center pixels 54. When an example is used to demonstrate a discussed detail, a pixel block corresponding to pixel block 44-1 of FIG. 4 may be used as an example with edge pixels 50-G, corner pixels 46-G, and center pixel 54-G. However, the example may be applied to any other pixel blocks corresponding to pixel blocks 44-2, 44-3, and 44-4 of FIG. 4.

Figure 6:
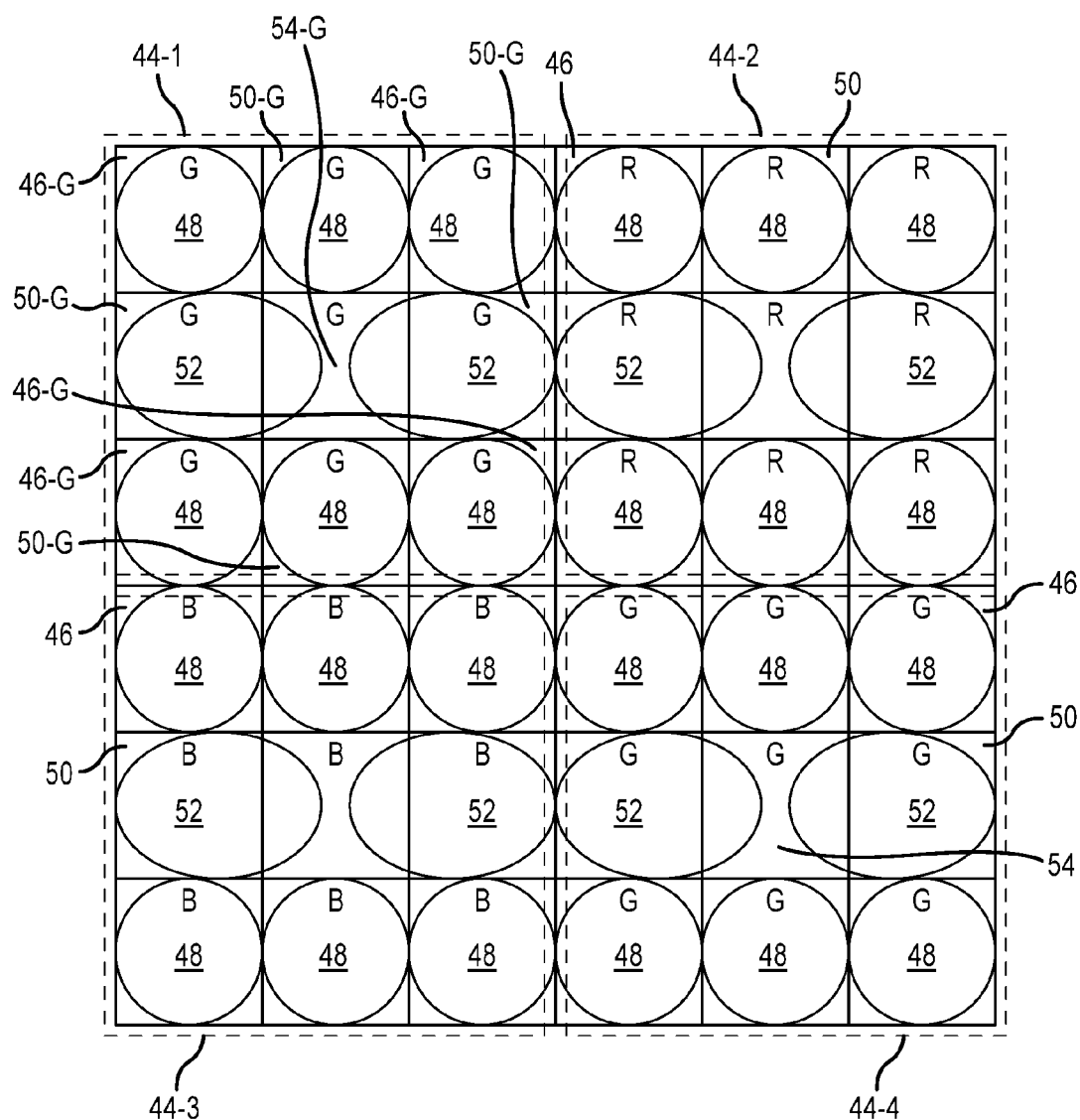
FIG. 6 is a top view of an illustrative pixel array with the microlens groups as shown in FIG. 4 while replacing a number of oversized microlenses with standard microlenses in accordance with an embodiment of the present invention.

In another embodiment, some of the oversized microlenses 52 in FIG. 4 may be replaced by standard microlenses to generate an alternative configuration for microlens groups as shown in FIG. 6. FIG. 6 shows an illustrative pixel array 42 having phase detection pixel blocks and various microlens groups. Pixel array 42 may include two standard microlenses 48 formed over edge pixels in the first and third rows of each respective pixel block 44. In such a microlens configuration, a phase detection pixel block may include edge pixels in the second row of each respective pixel block 44. The phase detection pixel block may include two edge pixels 50 that oppose each other. Center pixel 54 may be interposed between the two phase detection pixels. As an example, a phase detection pixel block of pixel block 44-1 may include two edge pixels 50-G in the second row. Since the phase detection pixel block of each respective pixel block 44 is elongated in the horizontal direction (e.g., the entire second row of each pixel block 44), the phase detection pixel block may be better suited to detect vertical edges.

If desired, the analogous configuration for columns instead of rows may be implemented. In such a configuration, pixels in the first and third columns of each pixel block 44 may each be covered by a standard microlens 48. Pixels in the second column of each pixel block may include two edge pixels 50 and center pixel 54. Two oversized microlenses 52 may cover the two edge pixels 50 and center pixel 54 in the same way as described in FIG. 4. In this type of embodiment, the phase detection pixel block may be better suited to detect horizontal edges.

Figure 7:
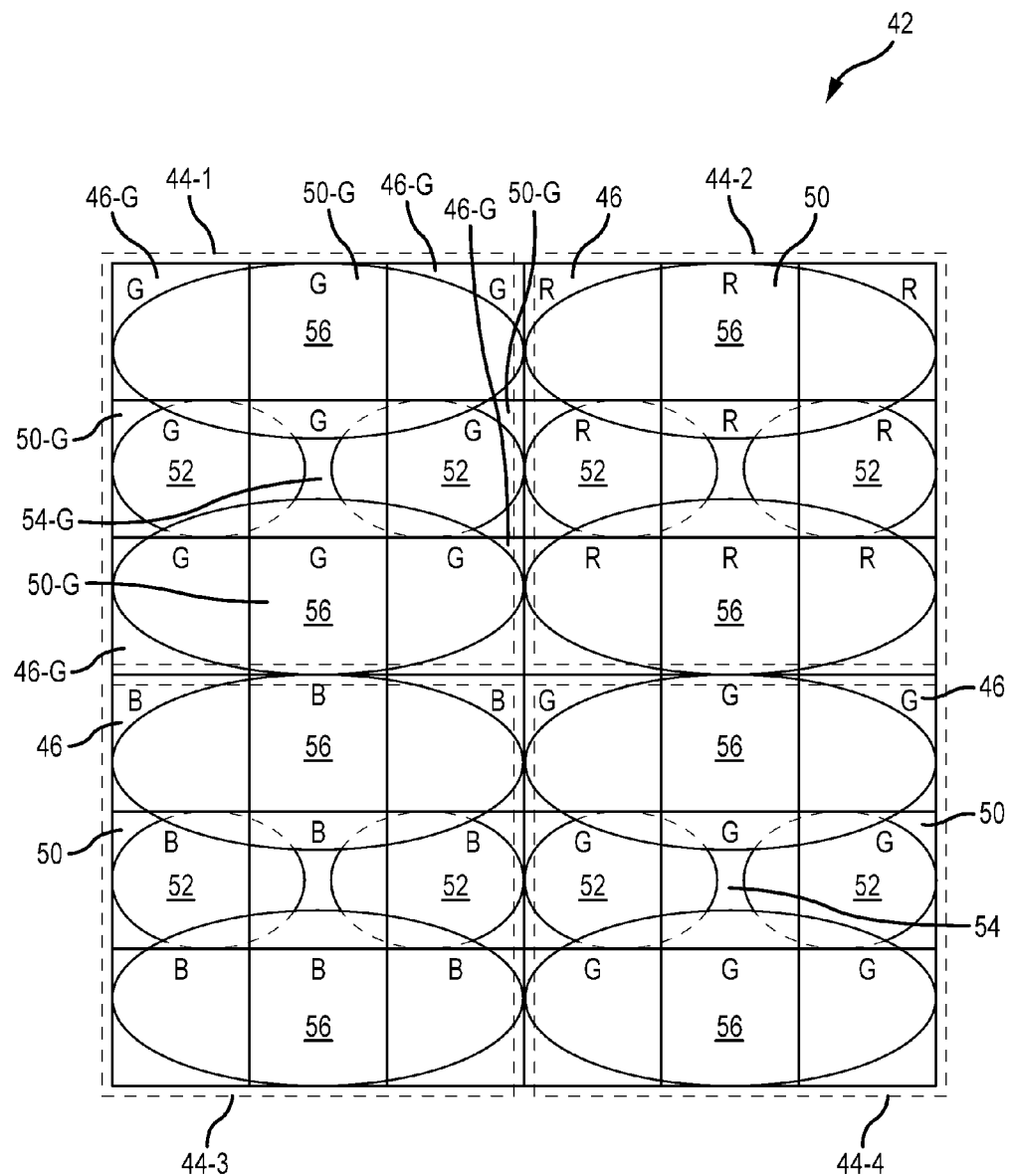
FIG. 7 is a top view of an illustrative pixel array with microlens groups having differently oversized microlenses in accordance with an embodiment of the present invention.

In another embodiment, all of the standard microlenses 48 in FIG. 6 may be replace by oversized microlenses to generate an alternative configuration for microlens groups as shown in FIG. 7. FIG. 7 shows an illustrative pixel array 42 having phase detection pixel blocks and various microlens groups. Pixel array 42 may include a single oversized microlens 56 that covers the two corner pixels 46 and one edge pixel 50 in the first row of each respective pixel block 44. Pixel array 42 may similarly include an oversized microlens 56 that covers the two corner pixels 46 and one edge pixel 50 in the third row of each respective pixel block 44.

Each oversized microlens 56 may be larger than each oversized microlens 52, since each oversized microlens 52 covers one edge pixel and one center pixel. Oversized microlens 56 may be formed to overlap portions of pixels in the second row (e.g., edge pixels 50-G and center pixel 54-G). The addition of oversized microlenses 56 may enhance the depth sensing capabilities of pixel array 20. The phase detection pixel block may include all six pixels in first and third columns of each respective pixel block 44. Since each oversized microlens is elongated horizontally, pixel array 42 may be better suited to detect vertical edges. If desired, oversized microlenses may be formed to be elongated vertically over each pixel block to enhance sensitivity to incident light on the horizontal edge.

Figure 8:
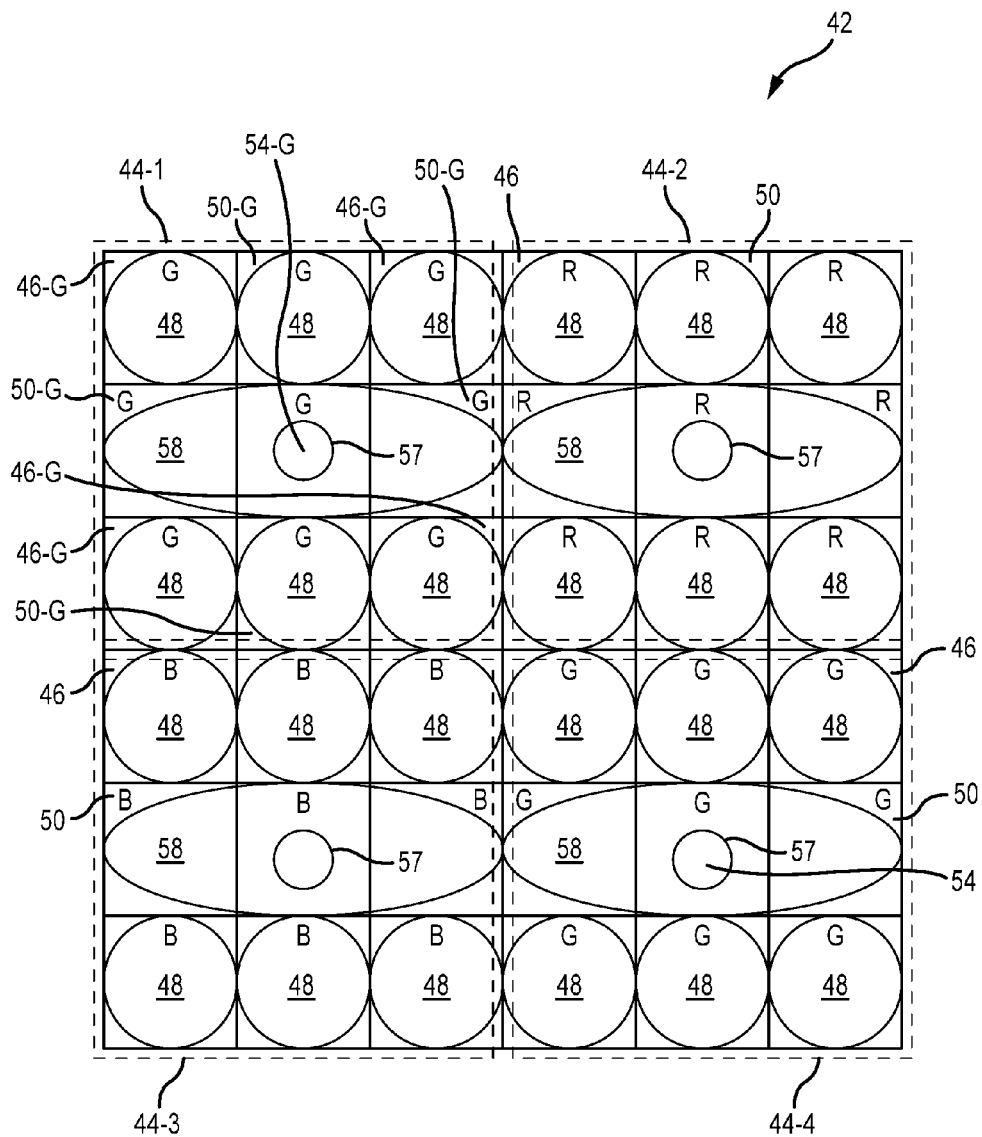
FIG. 8 is a top view of an illustrative pixel array with microlens groups as shown in FIG. 6 while replacing oversized microlenses with oversized microlenses with center openings in accordance with an embodiment of the present invention.

In another embodiment, the two oversized microlenses 52 in each pixel block of FIG. 6 may be replaced by a single toroidal microlens to generate an alternative configuration for microlens groups as shown in FIG. 8. FIG. 8 shows an illustrative pixel array 42 having phase detection pixel blocks and various microlens groups. Pixel array 42 may include toroidal microlenses 58. Toroidal microlens 58 may have an elliptical shape. Toroidal microlens 58 may include opening 57. Opening 57 may have a circular shape. Toroidal microlens 58 may cover the two edge pixels 50 and center pixel 54 in the second row of each pixel block 44. Toroidal microlenses 58 may be collectively called microlens group covering two-and-a-half pixel. Opening 57 may be formed over center pixel 54.

In such a configuration, the phase detection pixel block may include the two edge pixels 50. Similar to pixel array 42 in FIG. 6, the phase detection pixel block of each respective pixel block may be better suited to detect vertical edges. In operating pixel array 42 with HDR capabilities, center pixel 54 may be used as a low light exposure pixel. The two edge pixels covered by toroidal microlens 58 may be used as a high light exposure pixel. The rest of the pixels in pixel block 44 may be used as normal light exposure pixels.

If desired, the analogous configuration for columns instead of rows may be implemented. In such a configuration, pixels in the first and third columns of each pixel block 44 may each be covered by a standard microlens 48. Pixels in the second column of each pixel block may include two edge pixels 50 and center pixel 54. A single toroidal microlens may cover the two edge pixels 50 and center pixel 54 in the second column.

Figure 9:
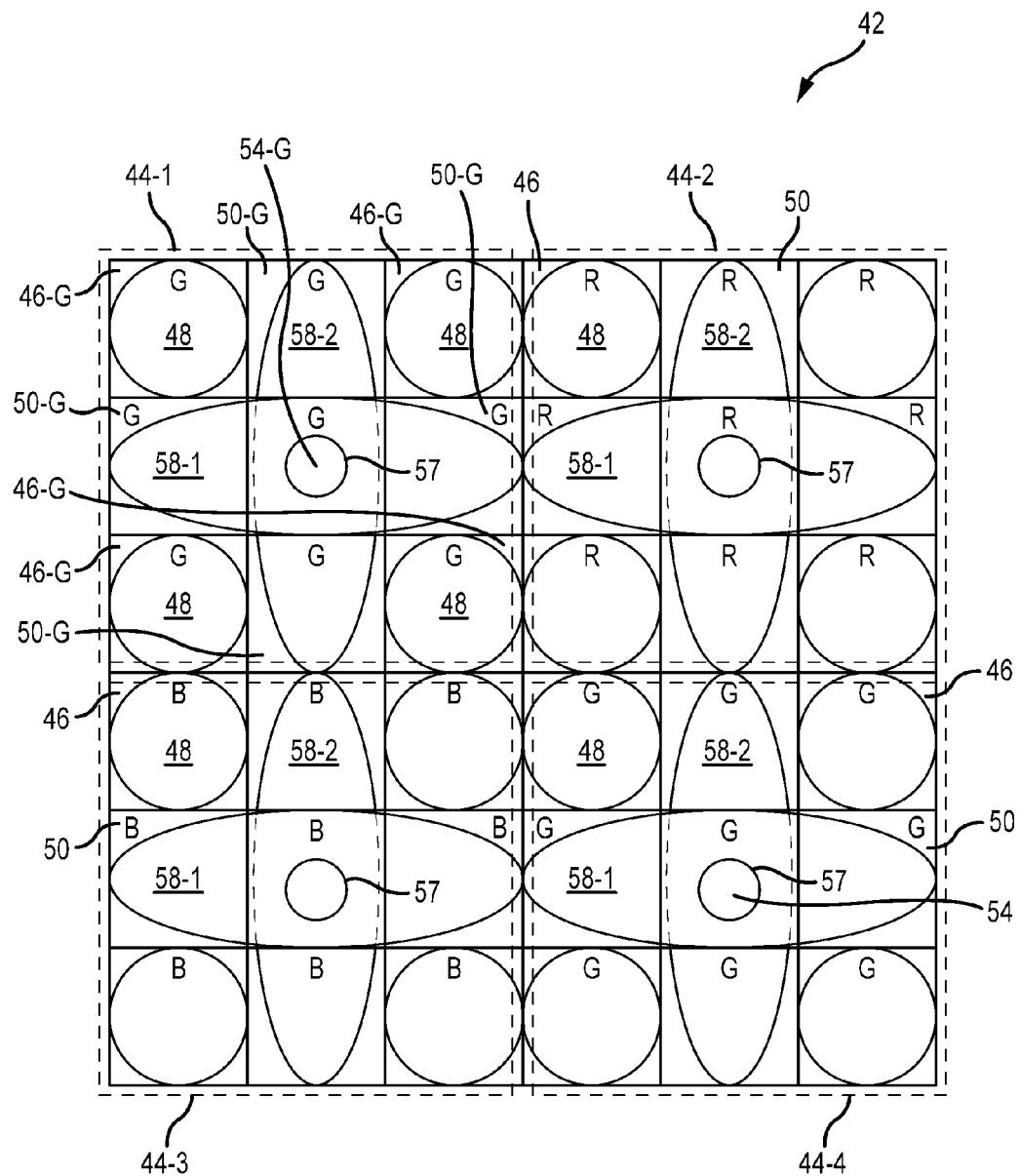
FIG. 9 is a top view of an illustrative pixel array with microlens groups as shown in FIG. 8 while replacing a number of standard microlenses with oversized microlenses with center openings in accordance with an embodiment of the present invention.

In another embodiment, standard microlenses 48 covering edge pixels 50 in FIG. 8 may be replaced by a second toroidal microlens to generate an alternative configuration for microlens groups as shown in FIG. 9. FIG. 9 shows an illustrative pixel array 42 having phase detection pixel blocks and various microlens groups. Pixel array 42 may have a toroidal microlens 58-1 that covers pixels in the second row of pixel block 44 (e.g., two opposing edge pixels 50 in the same row and center pixel 54) as described in FIG. 8. Additionally, a second set of toroidal microlenses 58-2 may cover pixels in the second column of pixel block 44 (e.g., two opposing edge pixels 50 in the same column and center pixel 54). Toroidal microlens 58-1 may overlap toroidal microlens 58-2 above center pixel 54. Alternatively, toroidal microlens 58-2 may overlap center pixel 54. Toroidal microlenses 58-1 and 58-2 may share opening 57. Opening 57 may be formed over center pixel 54.

Figure 10:
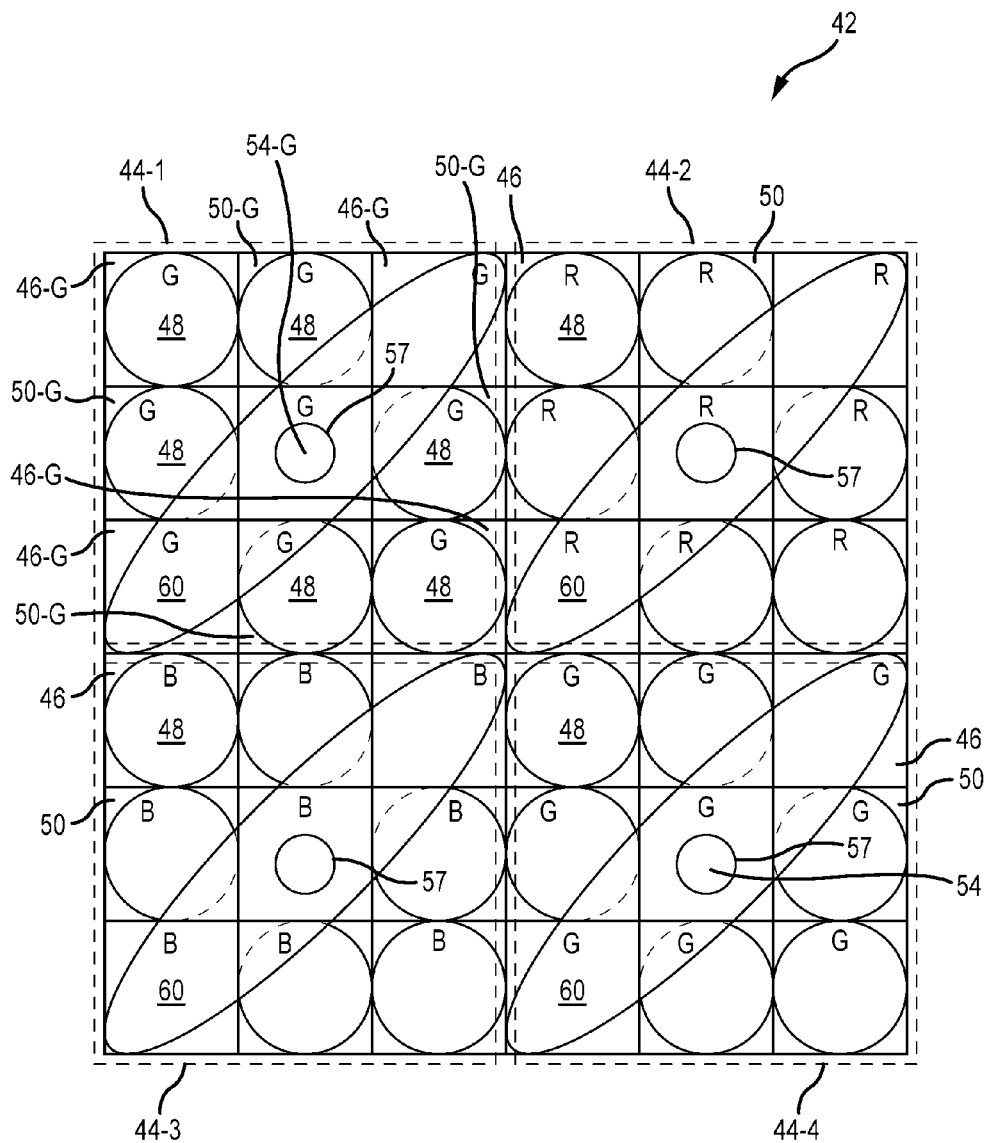
FIG. 10 is a top view of an illustrative pixel array with microlens groups having standard microlenses and diagonally oversized microlenses with center openings in accordance with an embodiment of the present invention.

In another embodiment, pixel array 42 may include toroidal microlenses that are formed over a diagonal of pixel block 44. FIG. 10 shows an illustrative pixel array 42 having phase detection pixel blocks and various microlens groups. Pixel array 42 may have pixel blocks 42 with nine pixels in a 3×3 array and a Bayer mosaic pattern as described in FIG. 4. Standard microlenses 48 may be formed over the four edge pixels 50 in each respective pixel block 44. Additionally, standard microlenses may also be formed over two corner pixels 46 that diagonally opposes each other. The remaining two corner pixels 46 and center pixel 54 may be covered by a diagonal toroidal microlens 60. For example, a first type of diagonal toroidal microlens 60 may cover a bottom-left corner pixel of pixel block 44 and an opposing top-right corner pixel of pixel block 44. In another example, a second type of diagonal toroidal microlens 60 may cover a top-left corner pixel of pixel block 44 and an opposing bottom-right corner pixel of pixel block 44. If desired, pixel array 42 may include a combination of the first and second types of diagonal toroidal microlens 60. If desired, pixel array 42 may alternatively include only one type of diagonal toroidal microlens 60. Diagonal toroidal microlens 60 also may cover (e.g., overlap with) the four edge pixels 50. Toroidal microlens 60 may have opening 57. Opening 57 may be formed over center pixel 54.

Figure 11:
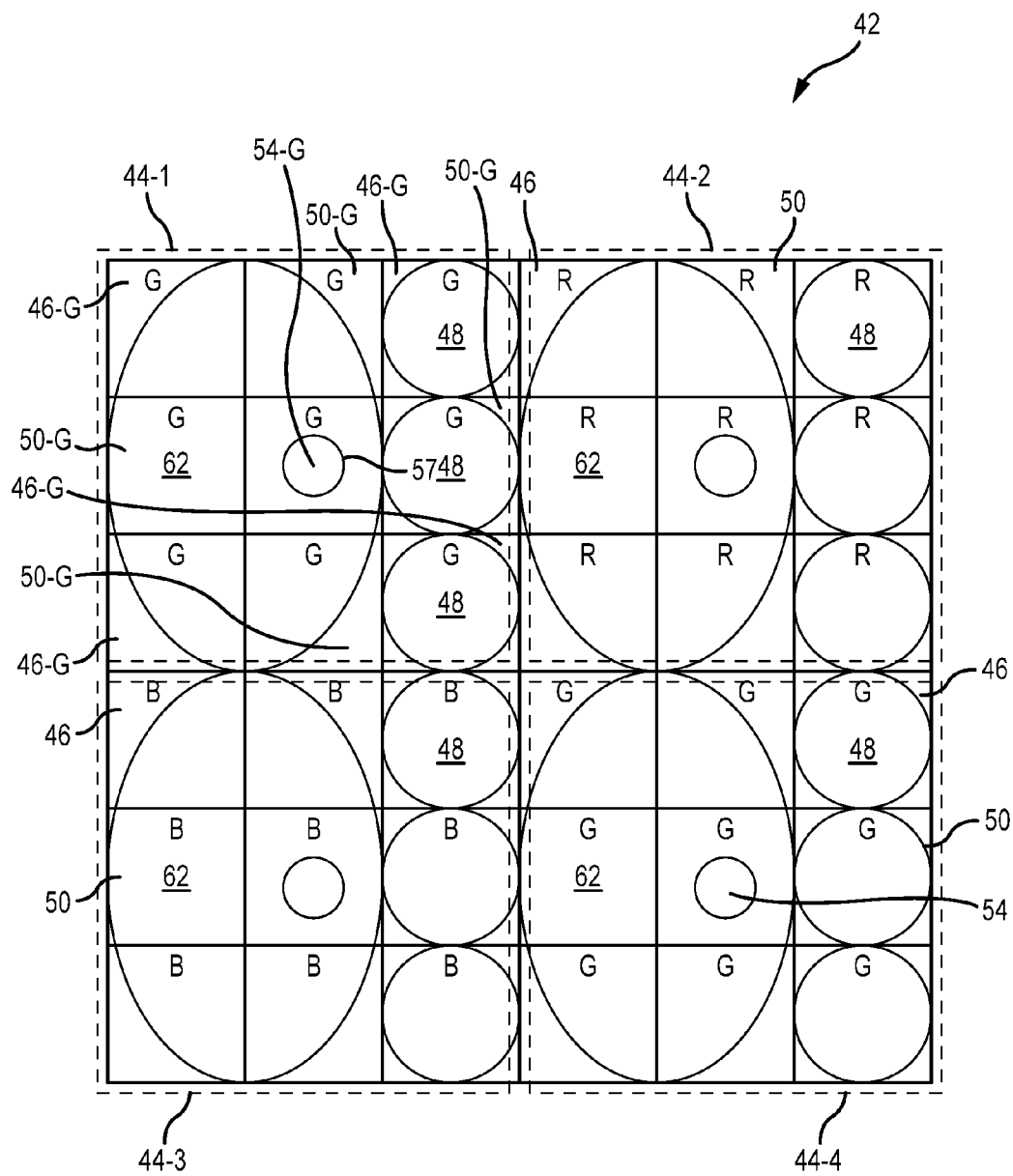
FIG. 11 is a top view of an illustrative pixel array with microlens groups having standard microlenses and rectangularly oversized microlenses with center openings in accordance with an embodiment of the present invention.

In another embodiment, pixel 42 may include oversized toroidal microlenses that may be formed over six pixels in a 2×3 pixel subarray. FIG. 11 shows an illustrative pixel array 42 having phase detection pixel blocks and various microlens groups. Pixel array 42 may have pixel blocks 42 with nine pixels in a 3×3 array and a Bayer mosaic pattern as described in FIG. 4. Three standard microlenses may be formed over three pixels in a third column of pixel block 44. Oversized toroidal microlens 60 may be formed over six pixels in a 2×3 pixel subarray (e.g., six pixels in first and second columns of pixel block 44). Oversized toroidal microlenses may have an elliptical shape. Oversized toroidal microlens may have a circular opening (e.g., opening 57). Opening 57 may be formed above center pixel 54.

Generally, in FIGS. 8-11, phase detection pixel blocks 100 may include non-center pixels that are asymmetrically covered by toroidal microlenses. Phase detection pixel blocks 100 may provide depth sensing functionalities to pixel array 42. To provide HDR capabilities to pixel array 42, pixels covered by standard microlenses 48 provide standard light exposure signals. Center pixels 54 or any desired pixel covered by toroidal microlenses 58, 60, and 62 with an opening over the desired pixel may provide low light exposure signals. Pixels covered by toroidal microlenses 58, 60, and 62 that are not covered by opening 57 may provide high light exposure signals.

In FIGS. 4-11, pixel array 42 may have microlens groups that repeat across pixel blocks 44-1, 44-2, 44-3, and 44-4. This is merely illustrative. If desired, all four pixel blocks may have different microlens group configuration. If desired, any of the pixel blocks may include a microlens group configuration that is not shown in the other pixel blocks. Such a configuration is shown in FIG. 12.

Figure 12:
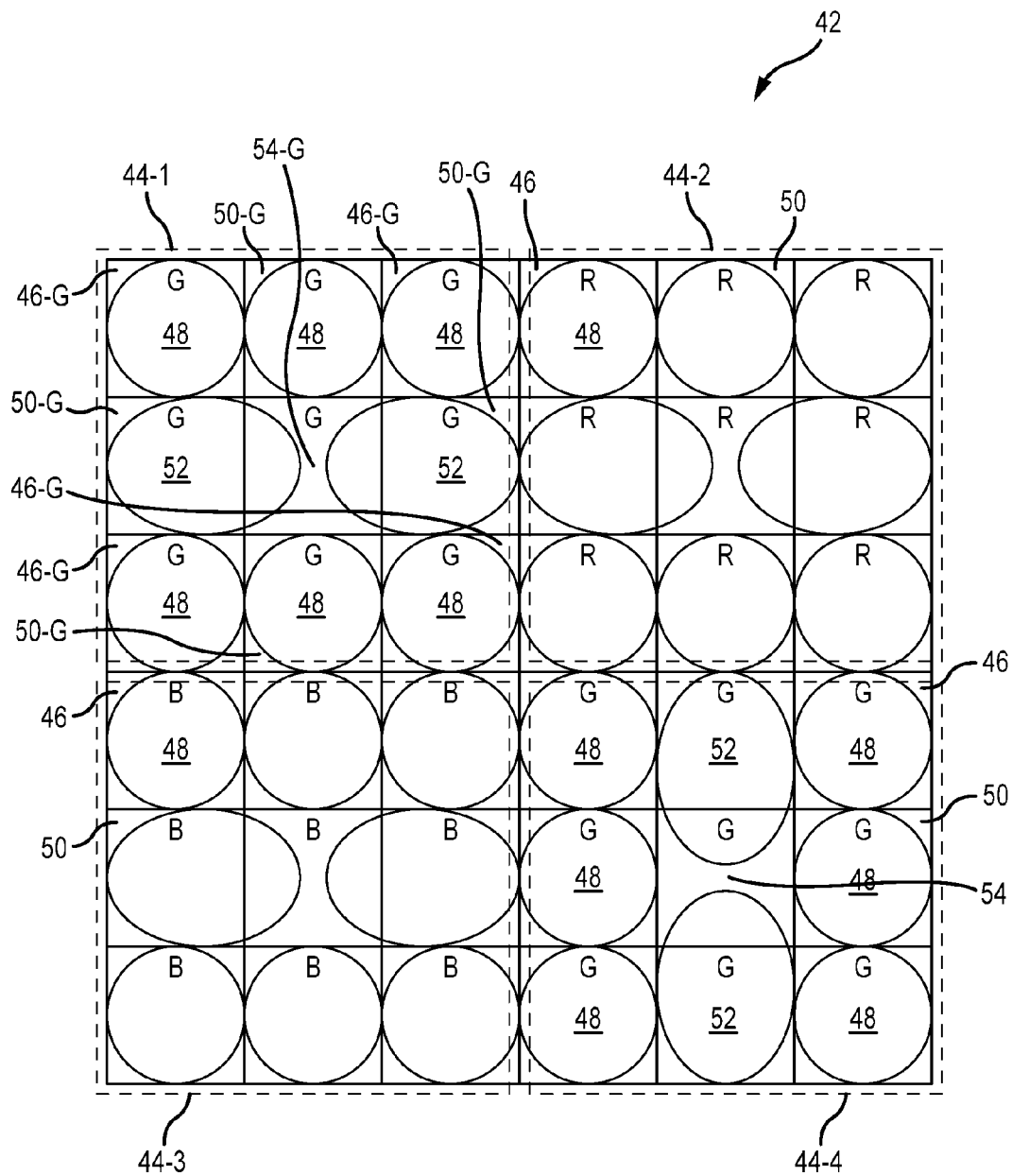
FIG. 12 is a top view of an illustrative pixel array with microlens groups as shown in FIG. 5 while changing the orientation of microlens groups over a single pixel block in accordance with an embodiment of the present invention.

FIG. 12 shows an illustrative pixel array 42 having phase detection pixel blocks and various microlens groups. Pixel array 42 in FIG. 12 may include pixel blocks 44-1, 44-2, 44-3, and 44-4. Pixel blocks 44-1, 44-2, and 44-3 may have the same microlens group configurations as the corresponding pixel blocks in Pixel array 42 in FIG. 4. However, pixel block 44-4 in FIG. 12 may have microlens configuration that is a 90-degree rotation of the microlens configuration covering pixel block 44-1. Pixels in first and third columns of pixel block 44-4 may be covered by standard microlenses 48. Each edge pixel 50 in a second column may be covered by an oversized microlens 52 that also partially covers center pixel 54.

In such a configuration, angular pixel data from pixel blocks 44-1 and 44-4 may be interpreted in combination to increase sensitivity in the horizontal direction when compared to pixel array 42 in FIG. 4.

In previous embodiments, pixel blocks may be a 3×3 pixel array. This is merely illustrative. Pixel blocks may be of any size (e.g., 4×4 pixel array, 5×5 pixel array, 2×4 pixel array, etc.). An example of a pixel array that have pixel blocks arranged in 5×5 pixel arrays is shown in FIG. 13.

Figure 13:
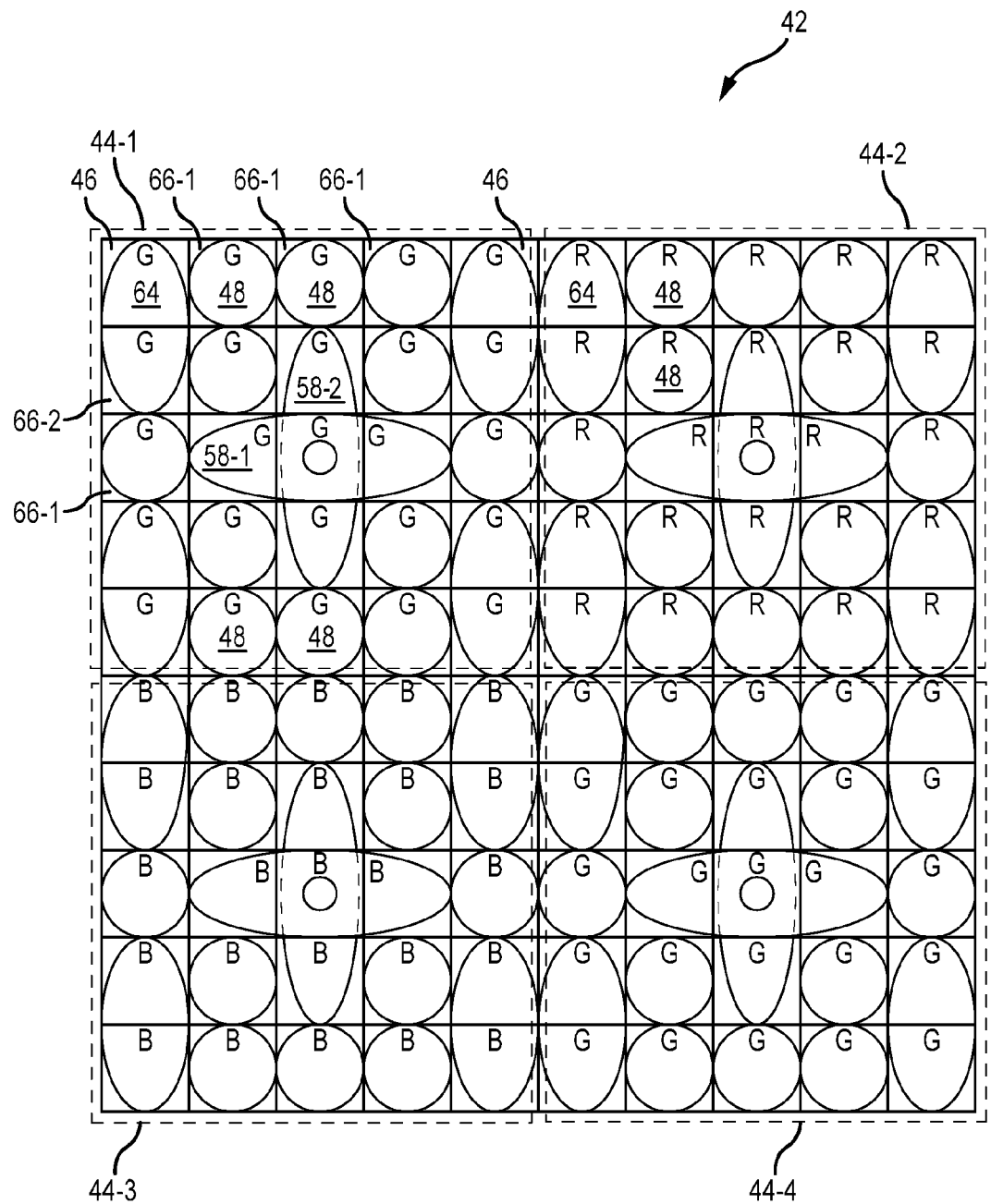
FIG. 13 is a top view of an illustrative pixel array with microlens groups having standard microlenses and differently oversized microlenses with center openings in accordance with an embodiment of the present invention.

FIG. 13 shows an illustrative pixel array 42 having phase detection pixel blocks and various microlens groups. Pixel array 42 may include pixel blocks 44-1, 44-2, 44-3, 44-4. Pixel block 44-1 may include a 5×5 pixel array, which may include pixels covered by green color filters. Pixel block 44-2 may include a 5×5 pixel array, which may include pixels covered by red color filters. Pixel block 44-3 may include a 5×5 pixel array, which may include pixels covered by blue color filters. Pixel block 44-4 may include a 5×5 pixel array, which may include pixels covered by green color filters. The inner 3×3 subpixel in each pixel block 44 may be the same 3×3 pixel array of each respective pixel block of FIG. 9. A first plurality of edge pixels 66-1 may be covered by standard microlenses 48. A second portion of edge pixels 66-2 may be covered by respective oversized microlenses 64. The second plurality of edge pixels 66-2 may be adjacent to respective corner pixels 46. The respective oversized microlenses 64 may also cover the respective corner pixels 46. The oversized microlens 64 may cover a portion of corner pixel 46. The oversized microlens 64 may cover a portion of an edge pixel of the second plurality of edge pixels 66-2. The portion of corner pixel 46 covered by oversized microlens 64 may be less than, equal to, or greater than the portion of the edge pixel of the second plurality of edge pixels 66-2 covered by oversized microlens 6

If desired, pixel blocks (e.g., pixel blocks 44-1, 44-2, 44-3, 44-4) may include other various color filter patterns that constitutes various desired pixel block color patterns. As an example, instead of a Bayer mosaic pattern, pixel block color patterns may reflect a RYYB color pattern, a RCCG color patter, RGB color pattern, RCCB color pattern, any other desired pattern (e.g., color patterns, monochrome patterns, infrared patterns), or a combination thereof. Pixels within each pixel block may also have various color filter patterns as shown in FIG. 5. Color filter patterns may repeat on the pixel level, pixel block level, or pixel array level either partially or completely. If desired, any combination of color filter patterns may be used to obtain a desired color resolution.

If desired, microlenses (e.g., standard microlenses, oversized microlenses, toroidal microlenses, oversized toroidal microlenses, etc.) described in FIGS. 4-13 may cover a varying portion of the corresponding pixel(s) to adjust the amount of incident light reaching the pixels. Pixel blocks covered by corresponding microlens groups of varying sizes and shapes may form super pixel blocks (e.g., phase detection pixel blocks and high dynamic range pixel blocks) that perform specific functions. If desired, the super pixel blocks may perform desired specific functions (e.g., HDR, angular detection, 3-D imaging).

Microlenses described in FIGS. 4-13 may be formed using any desired process (e.g., reflow, etch, etc.). Microlenses may be formed in multiple layers. As an example, standard microlenses may be formed over an entire pixel array as a first layer. Non-standard microlenses (e.g., oversized microlenses, toroidal microlenses, etc.) may selectively be formed over specific pixels. Non-standard microlenses may encroach upon a portion of various respective pixels (e.g., center pixels). Microlenses described previously may be of varying thickness, have varying refractive indices and have varying radii of curvature. As an example, a refractive index of a standard microlens may be different from a refractive index of an oversized or toroidal microlens to collect incident light more efficiently.

If desired, the groups of microlenses and blocks of pixels described in FIGS. 4-13 may form a repetitive pattern across pixel array 42. The repetitive pattern may completely cover pixel array 42 or partially cover pixel array 42. The repetitive pattern may cover pixel array 42 in defined geometric configurations (e.g., vertically, horizontally, or diagonally). Alternatively, the groups of microlenses and blocks of pixels described previously may be non-symmetrical with respect to adjacent pixels, pixel blocks, pixel subarrays, etc.

If desired, pixel blocks 44 may include varying pixel structures (e.g., pixels with varying photodiode charge storage capacities, pixels with nested photodiodes, pixels with multiple photodiodes) to enhance HDR or depth sensing functionalities.

Figure 14:
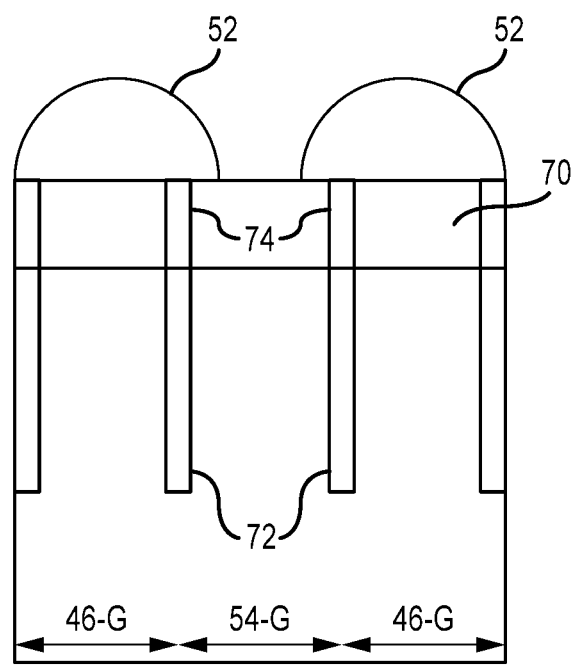
FIG. 14 is a partial cross-sectional side view of an illustrative pixel array of the type shown in FIG. 4 with central backside deep trench isolation and a composite grid in accordance with an embodiment of the present invention.

Pixel array 42 may have Backside deep trench isolation (BDTI) around any desired set of pixels or pixel blocks to reduce crosstalk and color scheme adjustments. As an example, FIG. 14 shows a cross section view of a pixel block along line A-A' as shown in FIG. 4. FIG. 14 shows a shielding element 74 formed around the periphery of the color filter elements 70 of the phase detection pixel block. FIG. 14 also shows isolation structure 72 (e.g., backside deep trench isolation 72) formed around center pixel 54-G. In FIG. 14, shielding elements 74 are formed around the color filter element of center pixel 54-G. Shielding elements 74 may be formed from tungsten or another desired metal. Shielding elements 74 may also be formed from a metal oxide or a composite material. For example, shielding elements 74 may contain one or more of silicon dioxide, silicon oxynitride, silicon nitride, tantalum, tantalum nitride, titanium, titanium nitride, tungsten, and tungsten nitride. In general, shielding elements 74 may be formed from any desired material or combination of materials that are opaque and therefore do not pass incident light. Color filter elements 70 may be formed in a layer having a top surface and a bottom surface. If desired, shielding elements 74 may extend only partially through the layer in which color filter elements 70 is formed (e.g., contacting only one of the top surface or the bottom surface, contacting neither the top surface nor the bottom surface). In the arrangement of FIG. 14 the shielding elements may sometimes be referred to as a composite grid.

As shown in FIG. 14, backside deep trench isolation 72 may be formed around pixel 54-G in the phase detection pixel block if desired. The backside deep trench isolation may provide additional shielding to avoid cross-talk between pixels 50-G and 54-G. Backside deep trench isolation structures 72 may be a p-type doped oxide (e.g., boron doped glass). In some embodiments, deep trench isolation structures 72 may instead be a p-type doped polysilicon (e.g., boron doped polysilicon). In other embodiments, deep trench isolation structures 72 may be a p-type doped polysilicon (e.g., boron doped polysilicon) having a liner (e.g., a phosphorous doped oxide liner). In yet other embodiments, deep trench isolation structures 72 may be a refractory metal (e.g., tungsten, molybdenum or any other suitable material) having a p-type oxide liner (e.g., boron doped oxide). If desired, deep trench isolation structures 72 may have a lining structure (e.g., liner) that may not be filled within (e.g., be hollow). In general, backside deep trench isolation 72 may be formed from any desired material. In FIG. 14, backside deep trench isolation is formed around each pixel. Backside deep trench isolation 72 may completely surround the photodiode of each pixel if desired.

In various embodiments of the present invention, an image sensor may have a pixel array, and the pixel array may include a plurality of image pixels that gather image data and a plurality of phase detection pixels that gather phase information. The phase detection pixels may be arranged in phase detection pixel blocks, and each phase detection pixel group may include edge pixels. The edge pixels of each phase detection pixel group may be covered by microlenses that also cover a portion of a center pixel. The pixel array may also include high dynamic range pixel blocks. Each high dynamic range pixel block may include pixels within the phase detection pixel block and other pixels (e.g., corner pixels).

A subset of the plurality of image pixels in the pixel array may be arranged in pixel blocks. Each pixel block may include a phase detection pixel block and a high dynamic range pixel block. The pixel array may include a plurality of pixel blocks. Each pixel block may have a different microlens groups that make up a different microlens configuration.

The pixel array may include a plurality of color filters. Color filters of each pixel block may be of a same color. If desired, Color filters of each pixel block may be of different colors. If desired color filters of different pixel blocks may be different colors. Light shielding structures may separate color filters covering each pixel. For example, a light shielding structure may surround a color filter of a center pixel. Isolation structures may separate pixels from one another. For example, a center pixel may be surrounded by an isolation structure.

Edge pixels may be covered by oversized microlenses, toroidal microlenses, or any other desired type of microlens. Each oversized microlens may cover an edge pixel and a portion of a center pixel. Each toroidal microlens may cover two edge pixels and a portion of a center pixel. Toroidal microlenses may have an opening that is over the center pixel. Oversized and toroidal microlenses may divert light from center pixels and redirect the light to the edge pixel they cover. Corner pixels may be covered by standard microlenses. Each standard microlens may cover one pixel (e.g., a corner pixel).

A pixel covered by a standard microlens may receive a first amount of light over a period. An edge pixel covered by an oversized or toroidal microlens may receive a second amount of light over the period. A center pixel covered by the same oversized or toroidal microlens may receive a third amount of light over the period. The second amount of light may be greater than the first amount of light. The third amount of light may be less than the first amount of light. The three amounts of light received may enable high dynamic range operations. The light received by multiple edge pixels covered by oversized or toroidal microlens may provide phase information.

The foregoing is merely illustrative of the principles of this invention and various modifications can be made by those skilled in the art without departing from the scope and spirit of the invention.

What is claimed is:

1. An image sensor having a pixel array, wherein the pixel array comprises:
   a plurality of pixels that gather image data and that each have respective and uniformly sized light collecting areas;
   a phase detection pixel block that gathers phase information, wherein the phase detection pixel block comprises a first pixel of the plurality of pixels and wherein the first pixel is covered by a first microlens; and
   a high dynamic range pixel block that comprises:
      the first pixel of the plurality of pixels, wherein the first pixel receives a first amount of light over a first time period;
      a second pixel of the plurality of pixels, wherein the second pixel receives a second amount of light over the first time period, wherein the first amount of light is greater than the second amount of light; and
      a third pixel of the plurality of pixels, wherein the third pixel receives a third amount of light over the first time period, wherein the second amount of light is greater than the third amount of light, and wherein the first microlens that covers the first pixel also covers at least a portion of the third pixel.

2. The image sensor of claim 1, wherein the high dynamic range pixel block further comprises:
   a fourth pixel of the plurality of pixels, wherein the phase detection pixel block further comprises the fourth pixel.

3. The image sensor of claim 2, wherein the fourth pixel is covered by a second microlens and wherein the second microlens covers the fourth pixel and covers at least a portion of the third pixel.

4. The image sensor of claim 3, wherein the second pixel is covered by a third microlens, wherein the first microlens covers a first area of the plurality of pixels, wherein the third microlens covers a second area of the plurality of pixels, and wherein the first area is larger than the second area.

5. The image sensor of claim 4, wherein the high dynamic range pixel block further comprises:
   a plurality of color filters that each cover a pixel, wherein the plurality of color filters are formed over the high dynamic range pixel block.

6. The image sensor of claim 5, wherein each of the plurality of color filters has the same color.

7. The image sensor of claim 2, wherein the fourth pixel is covered by the first microlens.

8. The image sensor of claim 7, wherein the first microlens has an opening and wherein the opening is above the third pixel.

9. The image sensor of claim 2, wherein the high dynamic range pixel block further comprises:
   a fifth pixel of the plurality of pixels, wherein the phase detection pixel block further comprises the fifth pixel; and
   a sixth pixel of the plurality of pixels, wherein the phase detection pixel block further comprises the sixth pixel.

10. The image sensor of claim 9, wherein the fifth pixel is covered by a fourth microlens and wherein the fourth microlens covers at least a portion of the third pixel.

11. The image sensor of claim 10, wherein the fourth microlens covers at least a portion of the sixth pixel.

12. An image sensor having a pixel array, wherein the pixel array comprises:

a pixel block that has a microlens configuration formed over the pixel block, wherein the pixel block comprises:
- a plurality of edge pixels that are exposed to a first amount of light during a first time period;
- a plurality of corner pixels that are exposed to a second amount of light during the first time period, wherein the second amount of light is less than the first amount of light and wherein each pixel of the plurality of corner pixels is covered by a single microlens; and
- a center pixel that is exposed to a third amount of light during the first time period, wherein the third amount of light is less than the second amount of light, wherein a first microlens covers a respective edge pixel, wherein the first microlens covers a portion of the center pixel and diverts incident light from the center pixel to the respective edge pixel, and wherein the plurality of edge pixels, the plurality of corner pixels, and the center pixel have respective light collecting areas of the same size.

13. The image sensor of claim 12, wherein a second microlens covers a second respective edge pixel of the plurality of edge pixels and wherein the second microlens covers a portion of the center pixel and diverts incident light from the center pixel to the second respective edge pixel.

14. The image sensor of claim 13, wherein a third microlens covers a third respective edge pixel of the plurality of edge pixels, wherein the third microlens covers a portion of the center pixel and diverts incident light from the center pixel to the third respective edge pixel, wherein a fourth microlens covers a fourth respective edge pixel of the plurality of edge pixels, and wherein the fourth microlens covers a portion of the center pixel and diverts incident light from the center pixel to the fourth respective edge pixel.

15. The image sensor of claim 13, wherein fifth and sixth microlenses cover the remaining pixels in the pixel block.

16. The image sensor of claim 12, wherein the pixel block further comprises:
- a plurality of color filters, wherein a color filter of the plurality of color filters is formed above the center pixel, wherein the color filter formed above the center pixel is surrounded by a shielding element, and wherein the center pixel is surrounded by an isolation structure.

17. The image sensor of claim 12, further comprising:
- a second pixel block that has a second microlens configuration formed over the second pixel block, wherein the microlens configuration is different from the second microlens configuration.

* * * * *